United States Patent [19]
Bok

[11] Patent Number: 4,521,268
[45] Date of Patent: * Jun. 4, 1985

[54] APPARATUS FOR DEPOSITION OF FLUID AND GASEOUS MEDIA ON SUBSTRATES

[76] Inventor: Edward Bok, Burgemeester Amersfoordtlaan 82, 1171 dr Badhoevedorp, Netherlands

[ * ] Notice: The portion of the term of this patent subsequent to Jan. 22, 2002 has been disclaimed.

[21] Appl. No.: 629,303

[22] Filed: Jul. 9, 1984

Related U.S. Application Data

[62] Division of Ser. No. 491,318, Apr. 25, 1983, Pat. No. 4,495,024.

[51] Int. Cl.³ .......................... B44C 1/22; B08B 5/04; C23C 13/08; B05D 5/12
[52] U.S. Cl. ...................... 156/345; 118/50; 118/728; 118/733; 134/99; 156/643; 156/646; 406/88; 355/76; 427/85; 427/248.1; 427/255.5; 430/434
[58] Field of Search .............. 156/643, 646, 345; 226/97; 406/88, 89; 134/31, 32, 34, 36, 99, 102; 355/53, 76; 118/715, 719, 728, 733, 50; 148/1.5, 187; 427/85, 248.1, 251, 255.5; 430/434

[56] References Cited

U.S. PATENT DOCUMENTS

| | | | |
|---|---|---|---|
| 2,848,820 | 8/1958 | Wallin et al. | 34/156 X |
| 3,704,685 | 12/1972 | Neumann et al. | 118/62 X |
| 4,292,745 | 10/1981 | Caratsch | 34/156 |
| 4,341,592 | 7/1982 | Shortes et al. | 156/643 |
| 4,406,388 | 9/1983 | Takashi et al. | 226/7 |
| 4,480,777 | 11/1984 | Suzuki et al. | 226/97 X |

*Primary Examiner*—William A. Powell
*Attorney, Agent, or Firm*—David H. Semmes; Warren E. Olsen

[57] ABSTRACT

Apparatus (10) for deposition of fluid and gaseous media on substrates (18), comprising a cabin (32), in which series of segments (34, 36, 38 . . . 68) are located aside a central passage (80, 96). Media, flowing through apertures between these segments towards and along substrates, passing through the passage, create microsized cushions (20, 22) aside such substrates for floating, transport and processing thereof.

39 Claims, 61 Drawing Figures

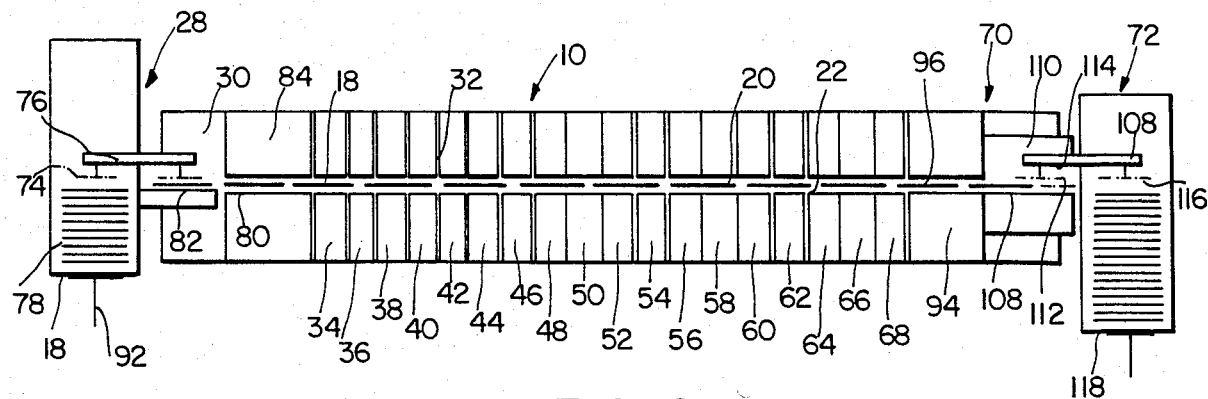
FIG. 2
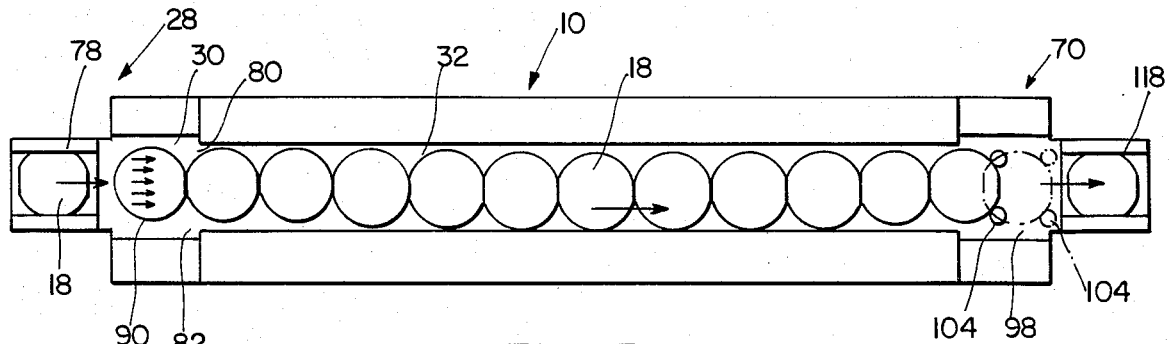
FIG. 3
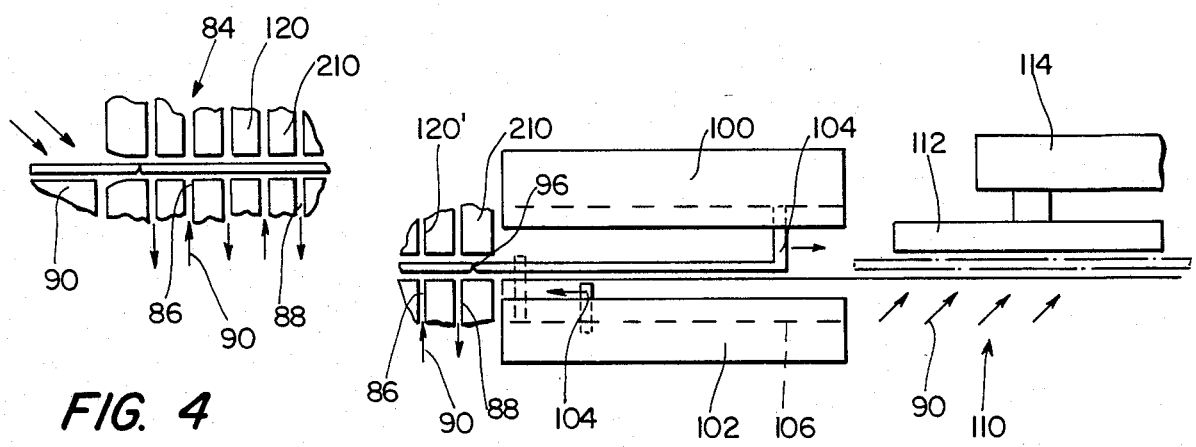
FIG. 4
FIG. 5

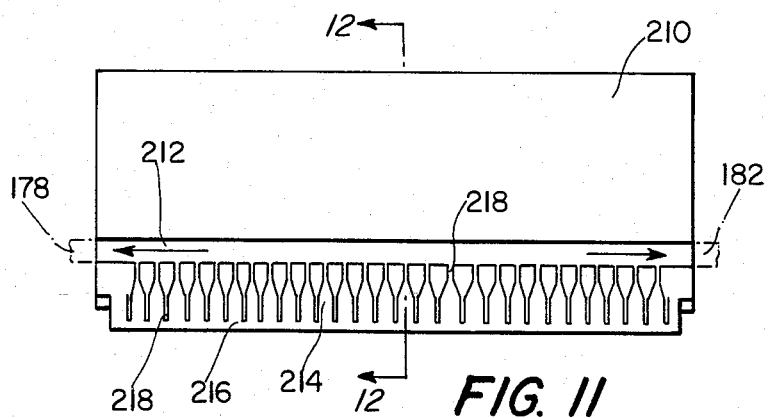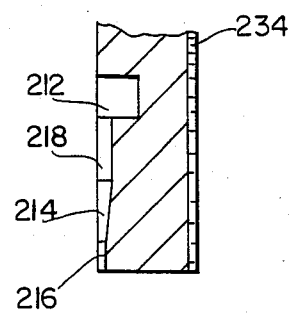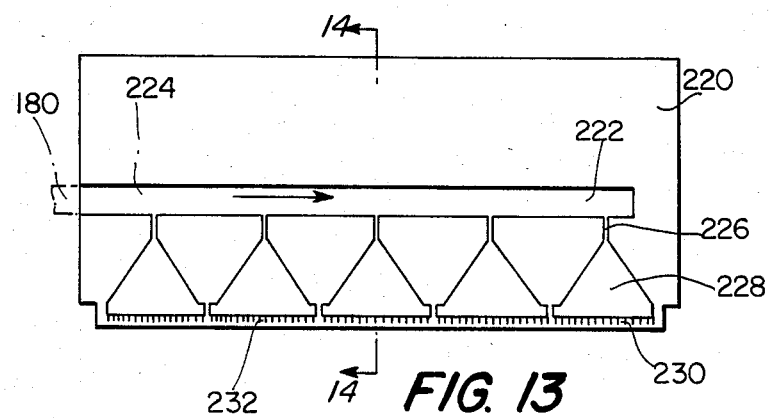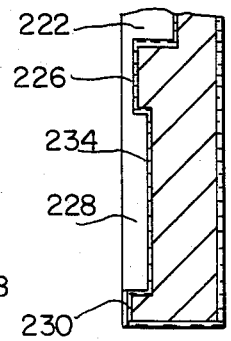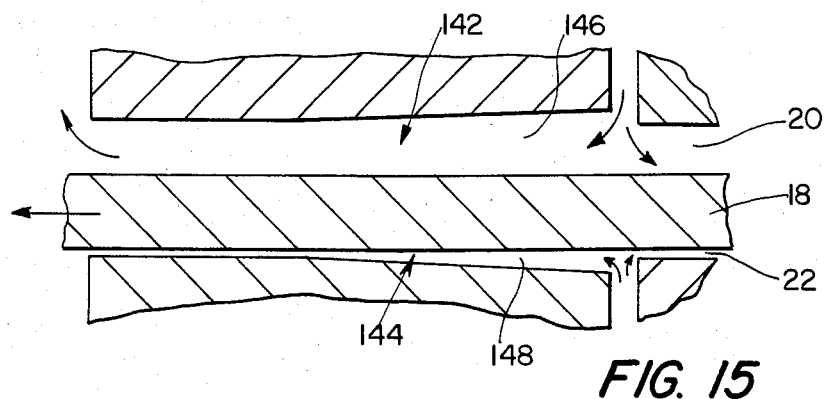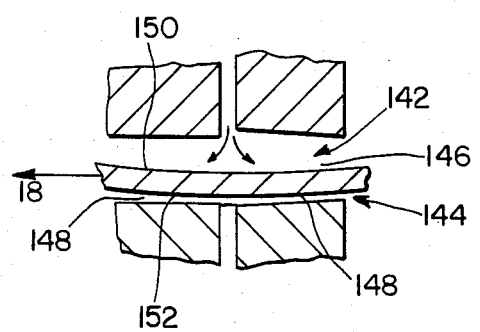

4,521,268

APPARATUS FOR DEPOSITION OF FLUID AND GASEOUS MEDIA ON SUBSTRATES

This application is a division of application Ser. No. 491,318, filed Apr. 25, 1983, now Pat. No. 4,495,024.

The invention relates to a method and apparatus to apply a film of fluid medium on a surface. Thereby use is made of submicro-filtered gaseous environment for this surface during the applying of such a film. The substrates, processed in that way, can be used in the microelectronica with the processing of silicon wafers and the like.

In The Dutch Patent Application No. 8 101 440 of the Applicant an appartus is disclosed for the applying of fluid medium on a substrate, whereby a guide wall has been used, along which the surface of the substrate to be processed is displaceable under direct contact with the wall, before in the process section medium is fed to this substrate. Thereby under vaccum force such substrate is urged against this wall. By extending the outlets of the fluid media towards near the extension of this guide wall a micro passage is obtained between the separation walls of such outlets and the substrate, in which passage media can flow along this substrate to the discharge channel.

The disadvantages of the apparatus with guide walls for the substrates are the following:

1. During the displacement of the substrate under vacuum force along such wall submicro particles can be removed from this substrate and as contamination affect the applied coating.
2. Via vacuum channels, positioned in such guide wall, coating or other medium can be suctioned on and seal off these channels.
3. After passing of the coating supply channel, the substrate can again take its original shape, with due to deformation thereof by touching of the passage wall of the cabin.
4. The suction forces can be too small, with irregularities in width of the passage and consequently variations in supply and discharge of the media.
5. There is no supply possible of high pressurized media to the substrate.
6. Variation in thickness of the substrate can cause a damage thereof.
7. After the applying of coating, the coated substrate surface may not be touched.

With the apparatus and method according to the invention these shortcomings are eliminated. Thereby the creation and maintaining of such media cushions in the passage aside the substrates, that at least the central section of such substrates cannot touch the wall of the supply- and discharge channels.

The substrates, used in the micro-electronica, have very small variations in thickness and have narrow tolerances in unflatness and bow. Consequently, the passage sections aside these substrates can be very narrow with a corresponding low consumption of media to maintain such cushion. The very limited height of the media cushions enables a large force of process media on the substrates with consequently a strong whirling action in these passage sections of the media. Due to this whirling action the processing is very intensive and so the length of processing is restricted. Also a continuous displacement of the substrates is possible during the processing.

The consumption of fluids and gaseous medium per substrate processed is limited and completely allowable in view of the high cost price of such substrates.

Further details regarding the apparatus and method follow from the description of the following figures:

FIG. 2 is a vertical cross section of an apparatus, in which the cabin according to FIG. 1 is used.

FIG. 3 is a horizontal cross section of the apparatus according to FIG. 2.

FIG. 4 is an enlarged fragmentary detail of the cross section according to FIG. 2 at the inlet section thereof.

FIG. 5 is an enlarged detail of the cross section according to FIG. 2 at the discharge section thereof.

FIG. 11 is a side view of a segment, in which discharge channels for media are located.

FIG. 12 is a cross section over line 12—12 of the segment according to FIG. 11.

FIG. 13 is a side view of a segment, in which channels for fluid medium are positioned.

FIG. 14 is a section section over line 14—14 of the segment according to FIG. 13.

FIG. 15 is a detail of the apparatus according to FIG. 2, whereby at one side the height of the medium cushion is greather than at the other side.

FIG. 16 is a detail of the apparatus according to FIG. 2, whereby a sharply bended substrate section is shown.

FIG. 17 is a vertical cross section of an apparatus with no one side a smooth guide wall for substrates to pass through.

Figure 43A:
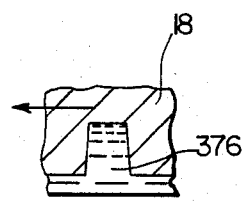
Figure 43B:
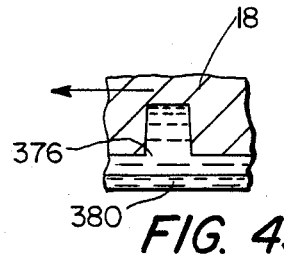

FIG. 43 schematically shows the appliance of such coatings.

Figure 44:
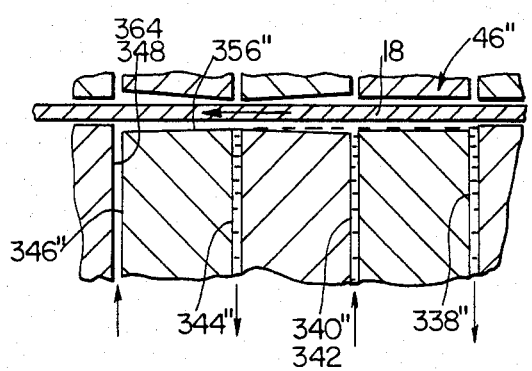

FIG. 44 is a sectional view of a coating station, wherein a gaseous medium acts as a transport means for thinner in vapor phase.

Figure 45:
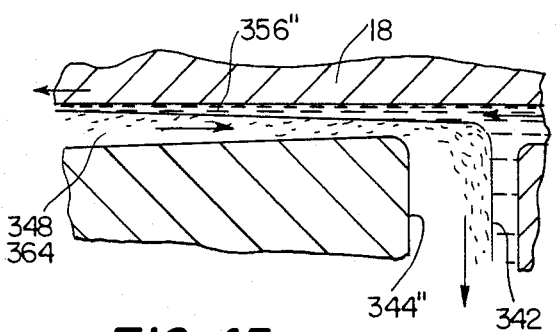

FIG. 45 is an enlarged sectional view of the inlet of a discharge channel of the station according to FIG. 44.

Figure 46:
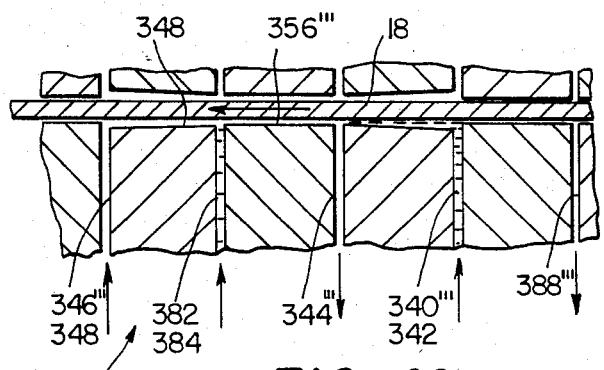

FIG. 46 is a longitudinal section of a coating station, wherein a film of water is fed over the applied coating.

Figure 47:
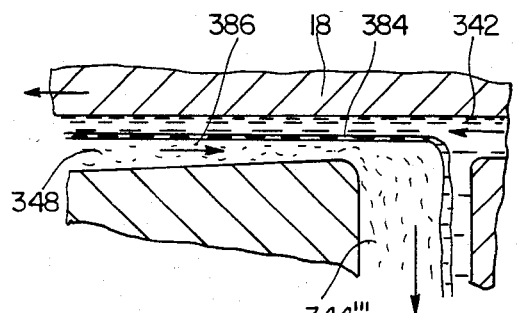

FIG. 47 is an enlarged sectional view of the inlet of the discharge channel of the station according to FIG. 45.

Figure 48:
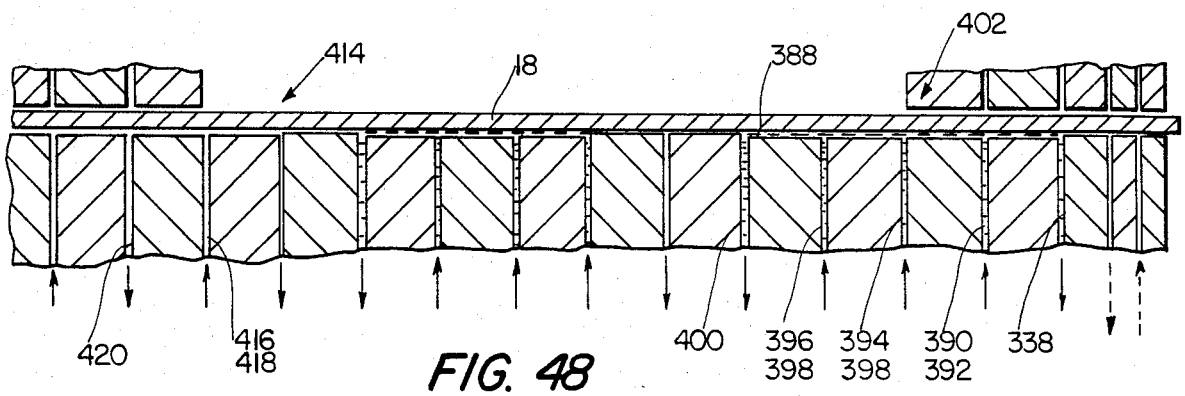

FIG. 48 is a sectional view of a station for the urging of developing agent over the substrate.

Figure 49:
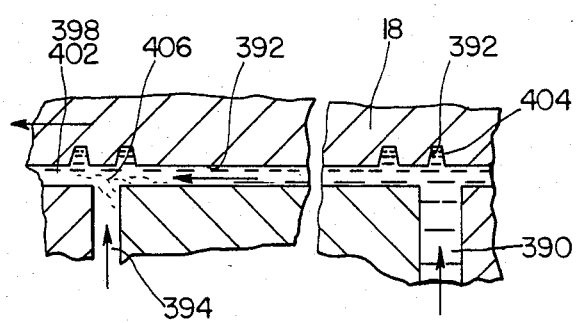

FIG. 49 is an enlarged longitudinal section of the outlet of the supply channels for the developing agent and the gaseous medium.

Figure 50:
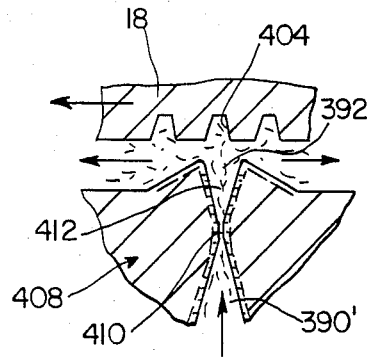

FIG. 50 is an enlarged sectional view of the outlet for developer.

Figure 51A:
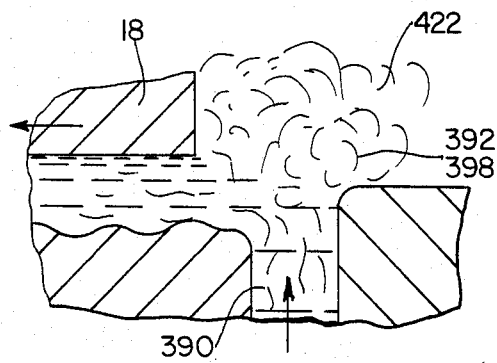
Figure 51B:
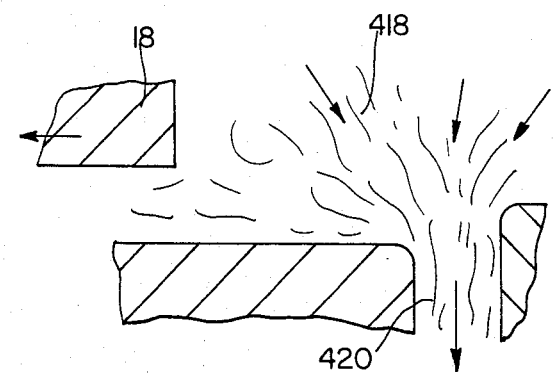

FIG. 51 shows the urging of developing agent in different positions of the substrate.

Figure 52:
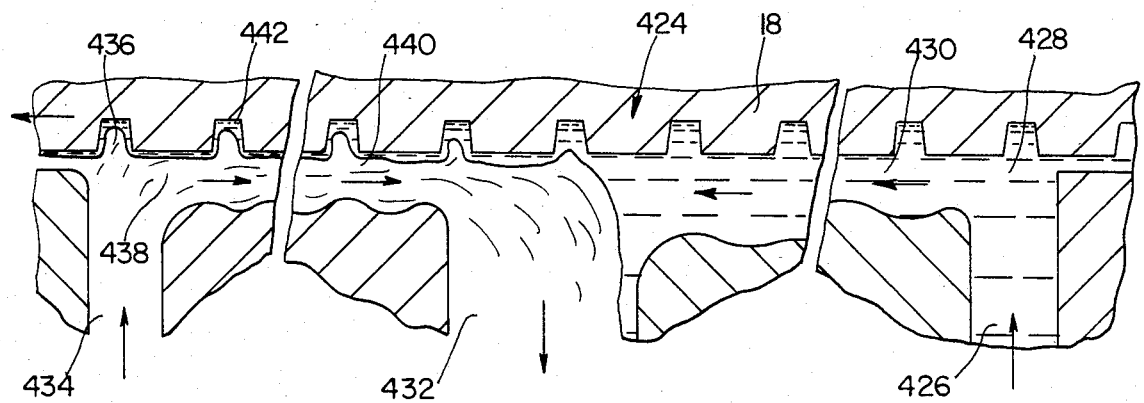

FIG. 52 is an enlarged sectional view of a station for urging a doping agent over the substrate.

Figure 53:
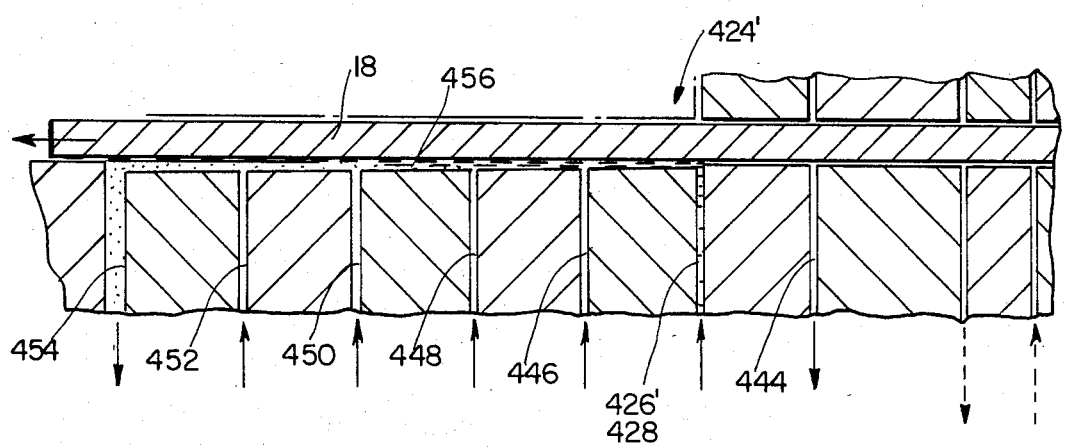

FIG. 53 is a sectional view of a modified doping station.

Figure 1:
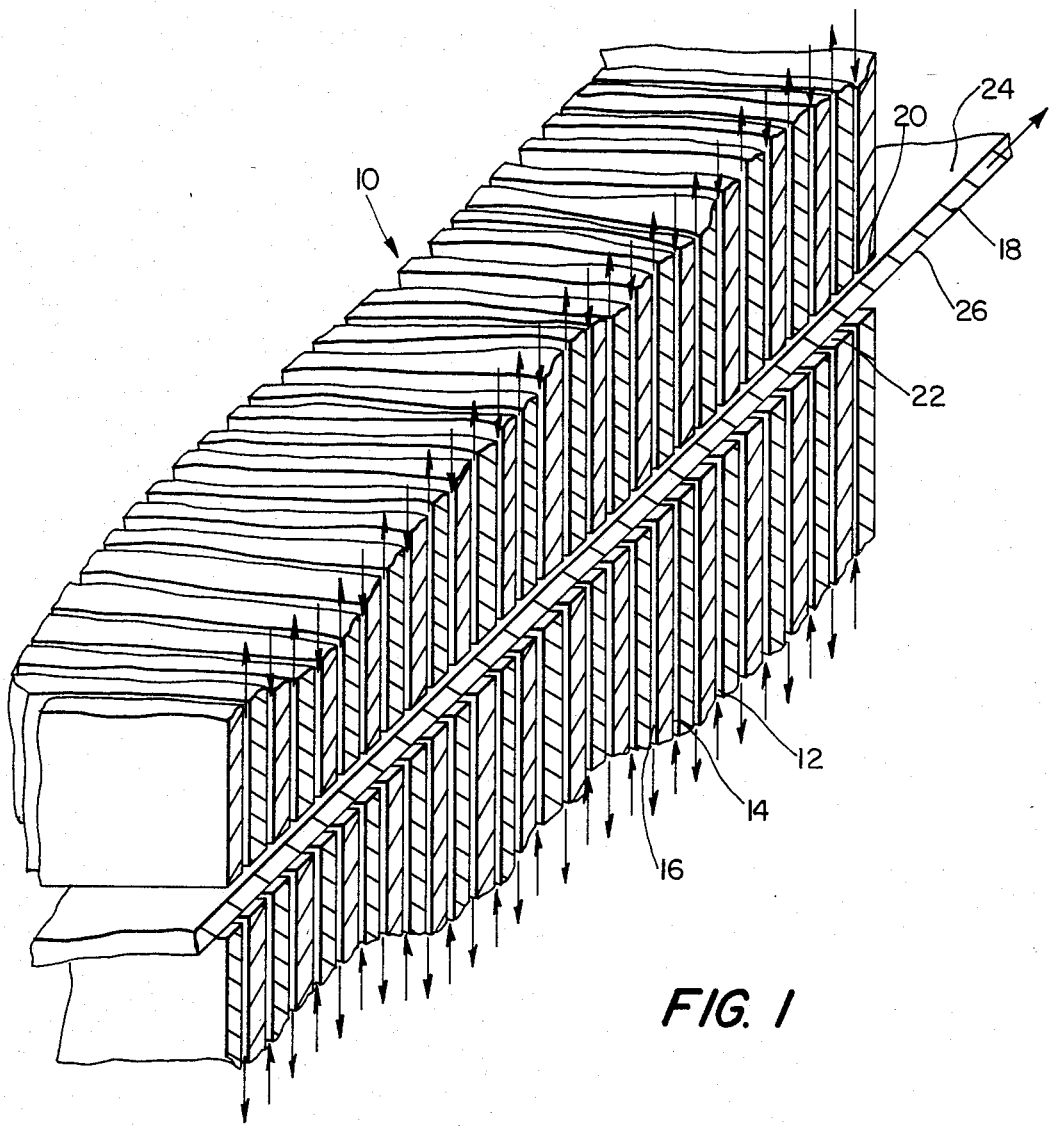
FIG. 1 is an enlarged perspective detail of the cabin, through which by means of micro media cushions the substrates are transported without contact with the environment.

In FIG. 1 part of the apparatus 10 is shown. Thereby by means of successive segments 12 with in between positioned narrow supply channels 14 for media and discharge channels for such media at both sides of the substrate 18 micro medium cushions 20 and 22 are maintained. In that way no mechanical contact can take place between at least sides 24 and 26 of the substrates and the interior of the cabin.

In FIGS. 2 and 3 again this apparatus is shown. Thereby the substrates 18 are transported from the supply station and via take-over station 30 to cabin 32. In this cabin the applying of media on these substrates take place, whereby the passing of the following stations: cleaning 34, drying 36, rinsing 38, drying and oven 40, adhesion coat 42, drying 44, first coat 45, drying 48, oven 50, cooling 52, second coat 54, drying 56, oven 56, cooling 60, third coat 62, drying 64, oven 66 and cooling 68.

There after the substrates are fed into the take-over station 70 and brought to the discharge station 72.

In the supply station by means of the vacuum block 74 of transporter 76 a substrate is taken from cassette 78, transported to take-over station 30, brought the guide 82 and by means of transport medium 90 via the narrow passage 80 in the inlet section 84 is urged into the cabin, see FIG. 4.

Figure 7:
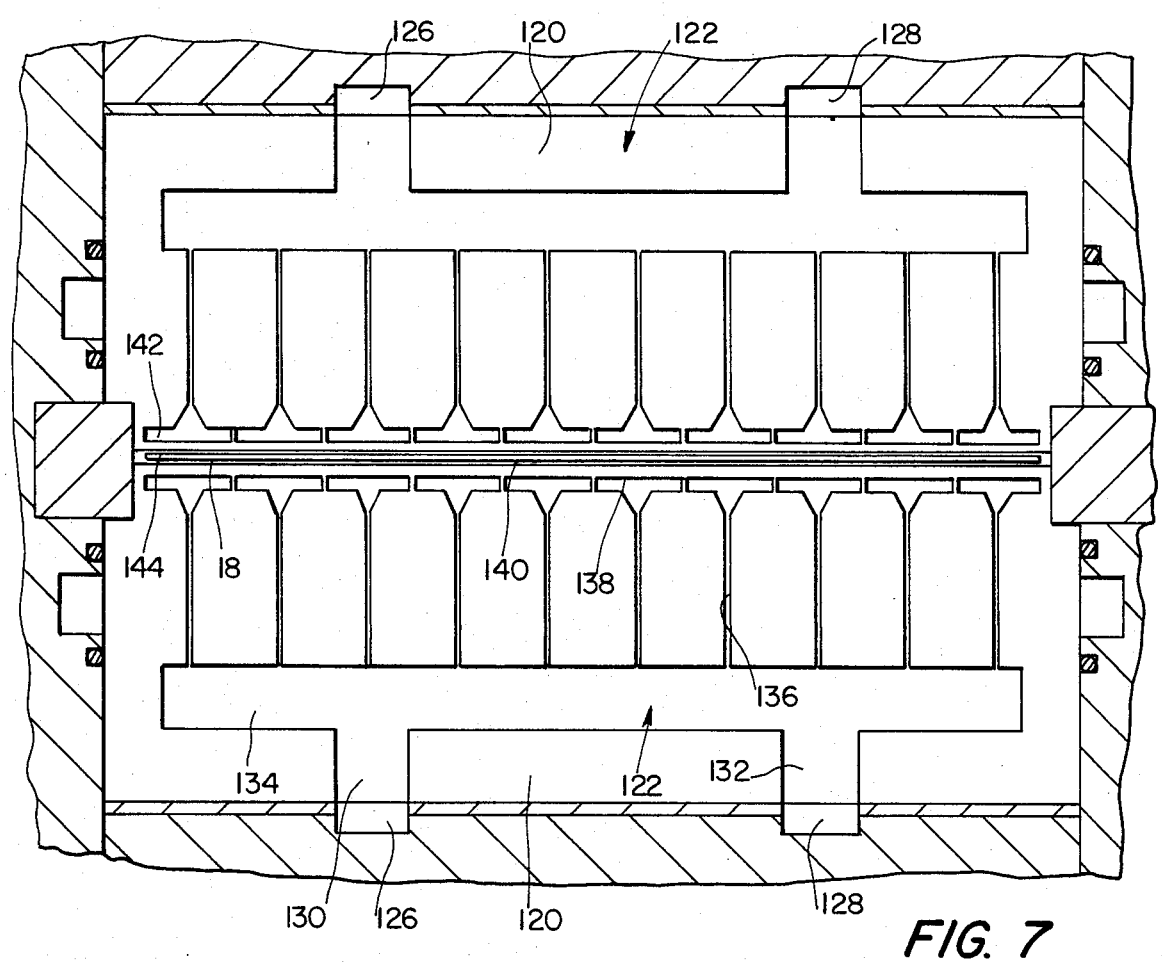
FIG. 7 is a partial cross section of the apparatus according to FIG. 2, in which over two segments supply channels for gaseous medium are shown.

In this section on both sides of passage 80 a number of segments 120 are positioned, wherein supply channels 66 for transport medium 90 are located, see also FIG. 7, and segments 210 with vacuum channels 88, see FIG. 11.

The processed substrate enters the discharge section 94 of cabin 32, with again on both sides of passage 96 a number of segments 120 and 210 and in between series of supply channels 86 for medium 90 and vacuum channels 88. Thereafter the substrates are fed into the transport section 98, see FIG. 5.

In view of production speed and consumption of medium it is important, that in cabin 32 successive substrates are close together and contact each other. Therefore, the combination of forces on the substrates are greater in the supply section then in discharge section.

Furthermore it is important, that the transport speed of the substrates remains the same. In view of this transport section two guide structures 100 and 102 are positioned, of which notches 104, successively before the substrates positioned, by means of mechanisms 106 transport these substrates over guide 108 to the take-over section 110.

Thereafter vacuum block 112 of transport mechanisms 114 transport such substrate to a free place 116 of cassette 118.

Figure 6:
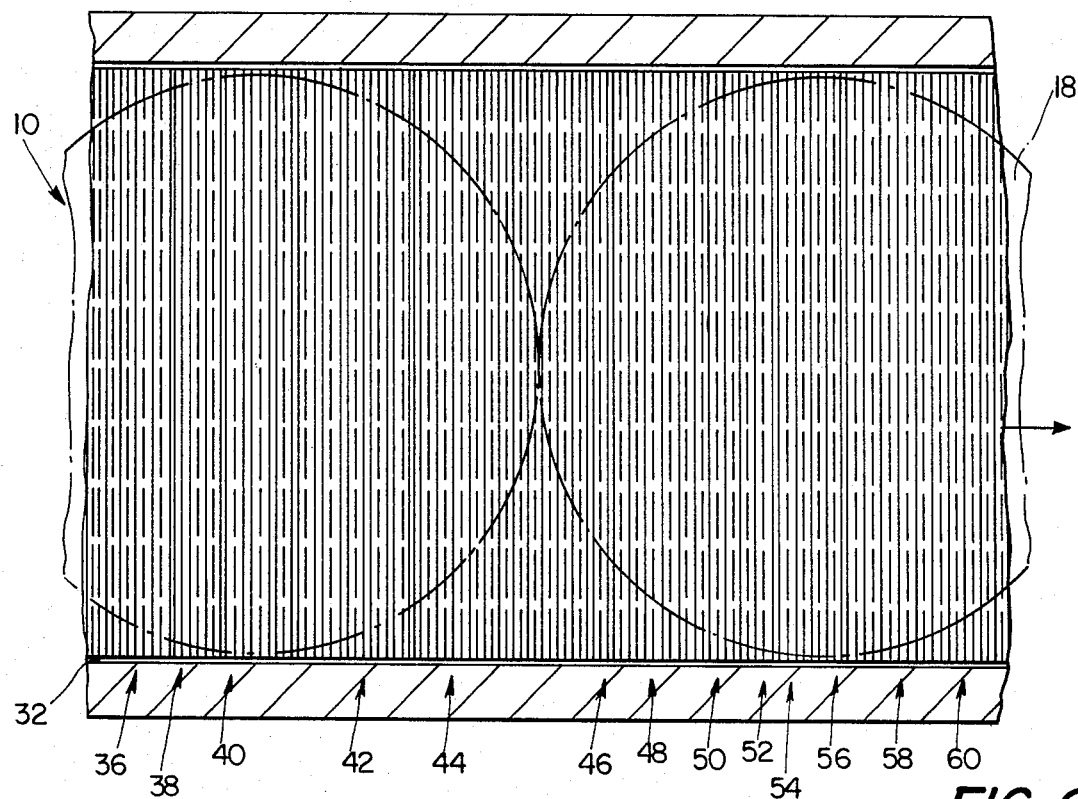
FIG. 6 shows a segment package with supply- and discharge channels.

The inlet- and discharge section of the cabin function as an air lock preventing air to enter the cabin. Such in combination with the substrates. In FIG. 6 stations are shown for successive processing of the substrates, passing through.

Figures 8, 9, 10, 10A:
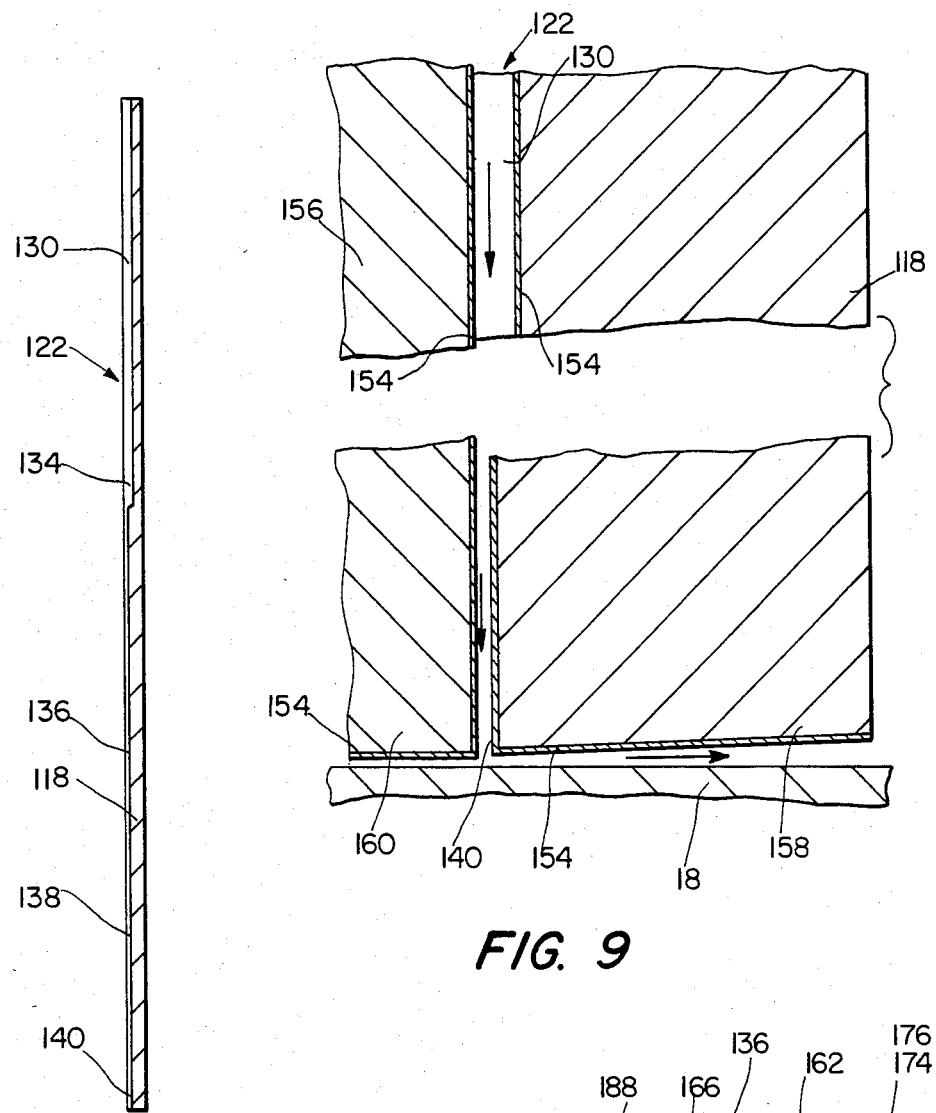
FIG. 8 is a longitudinal cross section of the segment according to FIG. 7.
FIG. 9 is an enlarged detail of the segment according to FIG. 8.
FIG. 10 is a cross section of the apparatus according to FIG. 2 with supply- and discharge channels for various media.
FIG. 10A is an enlarged fragmentary side elevation of the cabin according to FIG. 2.

In FIG. 7 a cross section if shown of cabin 10, with a side view of two identical segments 120, in which channels 122 for gaseous transport medium are located, see also FIGS. 8 and 9. This agent can preferably be nitrogen with fine filtering thereof.

In the upper cabin wall for each segment two supply channels 126 and 128 are positioned and whereby segment channels 130 and 132 correspond with these channels. These channels communicate with a relative wide main channel 134, in return communicating with a great number of extremely narrow branch channels 136. Spread channels 138 connect the branch channels with common ultra narrow channel 140 and so with the cabin passage.

Channels 136 have a considerably higher flow resistance for the medium as passage sections 142 and 144 aside the substrate 18 see FIGS. 15 and 16.

In that way each spread channel 138 is supplied with an almost constant flow of medium and such almost independant on the widths of passage sections 142 and 144. Therefore, if during the processing section 142 becomes larger than section 144, as is shown in FIGS. 15 and 16, in passage section 148 a considerably higher pressure will be established than in passage section 146 and ultimately with a minimum width of this section this pressure will become the high thrust pressure in spread channel 134.

In the other, then wide passage section 146, the pressure will drop to a very low value.

In that way a pressure difference of 2 bar or even more is possible between both passage sections 144 and 146 with such large thrusts on the substrate 18, that automatically this substrate will be brought to a position, whereby the force as a result of difference in pressure correspond with the local own forces in this substrate.

All media work together to maintain both cushions 20 and 22, whereas the structure of the segment packages on both sides of the passage is the same. Thereby on each cm² substrate surface on both sides over 200 media thrusts can work on such substrate.

In FIG. 16 is shown, how due to increases in temperature a considerable bending of substrate 18 has taken place. An increased flow of warm medium through wide passage section 146 and a restricted flow of such medium through narrow section 144 will result in a larger temperature increase at side 150 than at side 152 with consequently a stretching of the substrate to a balance position.

To prevent the wearing of the extremely narrow channels in segments 118 and 120, these channels are covered with a layer wear resistant material 154, see also FIG. 9. The corresponding sections of plate 156 can also be provided with such layer, as can also be the case with the ends 158 and 160.

Packages 162 and 164 are enclosed positioned in upper cabin section 166 and lower cabin section 168, see also FIG. 10. The segments have polished surfaces with very narrow tolerances in their dimensions.

In the side walls 170 and 172 of these cabin sections channels 178, 180, 182 and 184 are located, whereas in the other wall sections aside channels 126 and 128 a channel 136 can be positioned. These channels extend over a certain length of the cabin and can separately be connected with supply or discharge piping.

In the cabin walls seal strips 188 are mounted aside these channels. In the side walls in grooves 174 circular seal strips 176 are positioned.

In mounted position of the cabin sections 190 and 192 of the segments rest against mounting strips 194 and 196. Aside these strips seal strips 200 and 202 are positioned, whereas by means of bolts 204 the upper and lower cabin sections are connected with each other.

Within the scope of the invention these strips 194 and 196 can have a considerable size and can extend over the whole length of the cabin.

In FIG. 11 segment 210 is shown, in which a roomy vacuum channel 212 is located, see also FIG. 12. The ends of this channel correspond with the channels 178 and 182, located in the cabin sections 166 and 168. This channel 212 is via a great number of branch channels 214 is connected with common channel 216. In these channels narrow sections 218 are located to prevent a too easy discharge of medium via such as channel. The flow resistance of such channel is of great importance for the high vacuum channels 334, see FIG. 35 and 33B, see FIG. 38. Thereby in the passage sections between the substrate and the segment areas around such inlet of the vacuum channel 214 a high vacuum can be established and maintained, whereas near other inlets of this group of channels no substrate section has to be present. Such is periodically the case with almost circular substrates.

In FIG. 13 segment 220 is shown, wherein supply of fluid medium takes place. The main channel 222 is with its end 224 connected with channel 180 of the cabin sections 166 and 168. This channel is via a great number of extremely narrow channels 226 connected with separate spread channels 228, which in turn are connected with the extremely narrow common channel 230, see also FIG. 14. Thereby a great number of small wall sections 232 serve to maintain a constant width of this channel 1230, if an adjacent segment urges against such segment. These channels may also be provided with a layer 234 of wear resistant material, as is also the case with the corresponding sections of the adjacent segment.

Within the scope of the invention other profiles of the channels are possible and so also the number of channels can be different.

Figure 17:
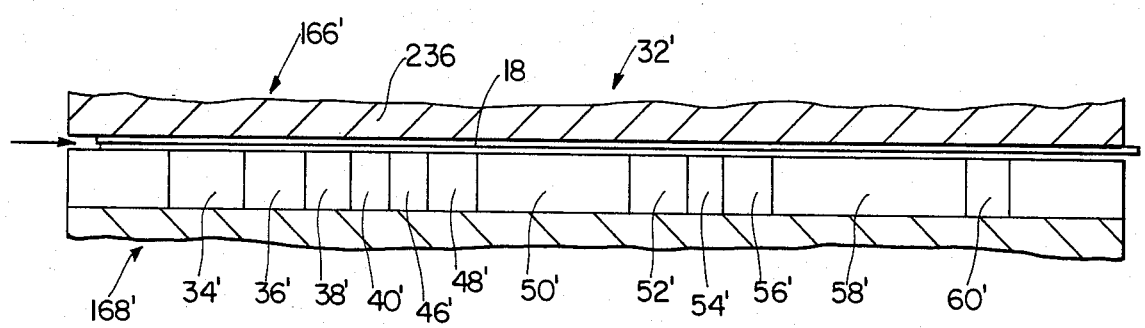

In FIG. 17 cabin 32' is shown, whereby only in the lower part 168' segments are positioned under the creation of various process stations. The upper part 166' of the cabin consists of a guide 236, along which the substrates 18 are displaceable.

Figure 18:
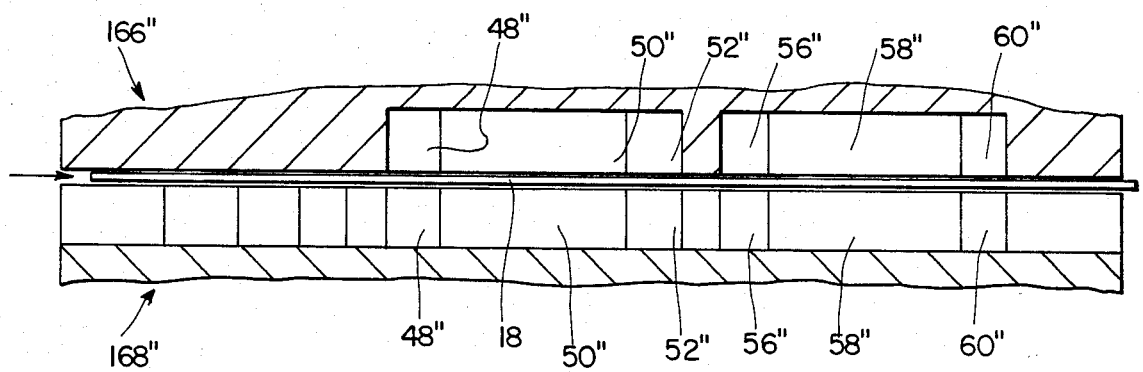
FIG. 18 is a vertical longitudinal section of a apparatus, with on one side both guidewall sections and micro medium cushion sections.

In FIG. 18 the cabin according to FIG. 17 is shown again, however with in the upper section 166' also a number of process stations. As a result a banding of the substrates or other deformations due to too great differences in temperature are prevented.

Figure 19:
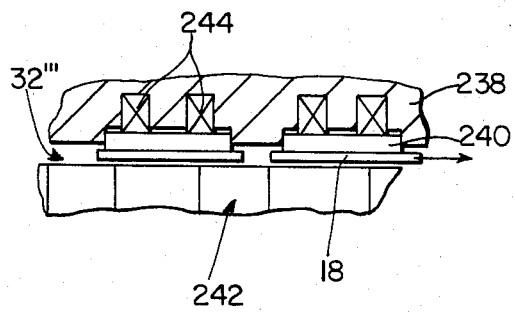
FIG. 19 is a cross section of a modified apparatus, which at one side is provided with vacuum holders for the substrates, mounted on a turn table.

In FIG. 19 the upper part of the cabin 23" is a turn table 238, on which a number of vacuum holders 240 are mounted to suction the substrates 18 thereon. In the lower part section 242 is positioned for processing of substrates. By means of one or more setting devices 244 per vacuum holder the distance between the corresponding substrate and the segments of the lower cabin part can be changed.

Figure 20:
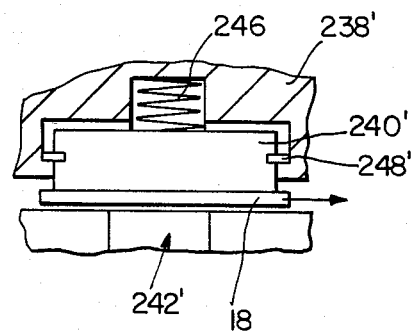
FIG. 20 is a cross section of a turn table section with a modified structure of the vacuum holder.

In FIG. 20 vacuum holder 240' urges against the notches 248 of turntable 238' and such under the force of spring 246. Thus from sections 242' flowing media urges the substrate upwardly against the force of spring 246 with the maintaining of the narrow process passage between the segments and the substrate.

Figure 21:
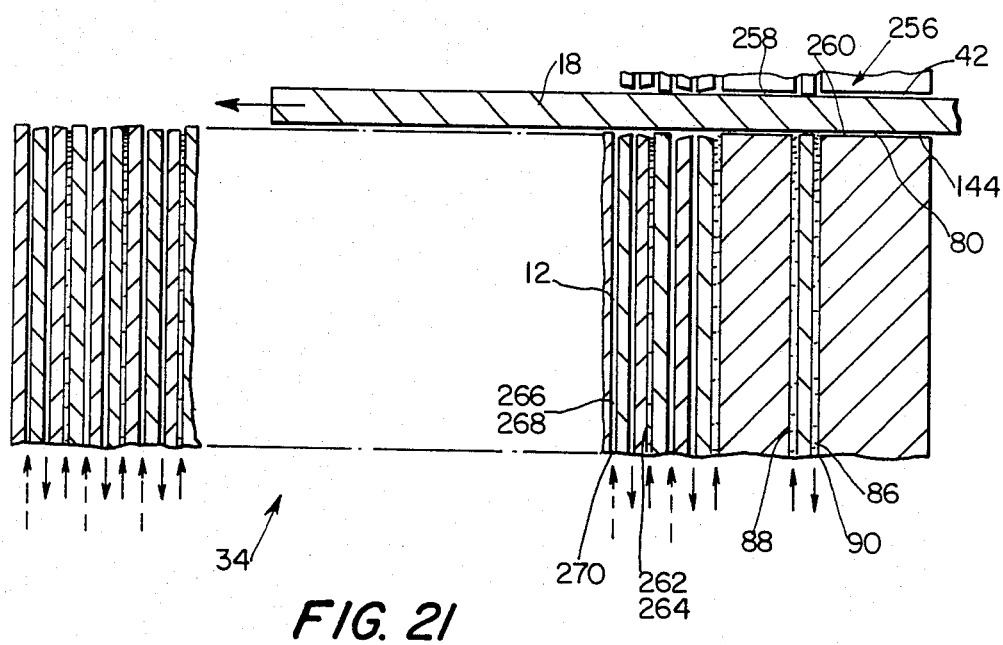
FIG. 21 is a cross section of a station for cleaning or rinsing.

In FIG. 21 part of the entrance 80 of the cabin and a cleaning station 34 is shown. The passage is created by two packages 256, in which several supply channels 86 for gaseous medium 90 and discharge channels 88 are positioned. The gaseous medium, flowing through the passage sections 142 and 144, maintain therewith cushions 258 and 260 and also contribute to the transport thrust, which is applied on the substrate in transport direction.

Figure 22:
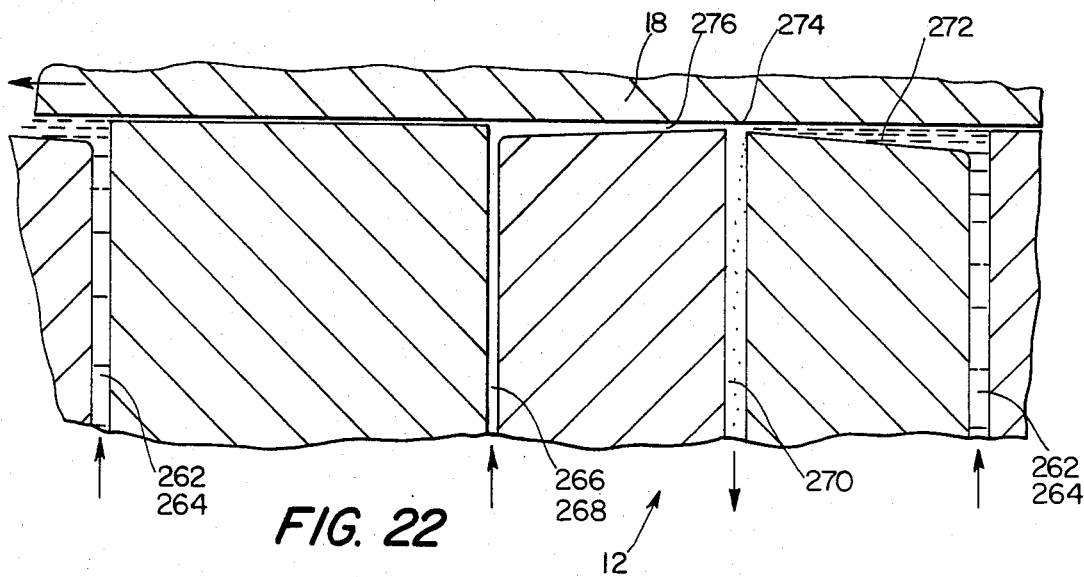
FIG. 22 is an enlarged cross section near the substrate of the station according to FIG. 21.
Figure 23:
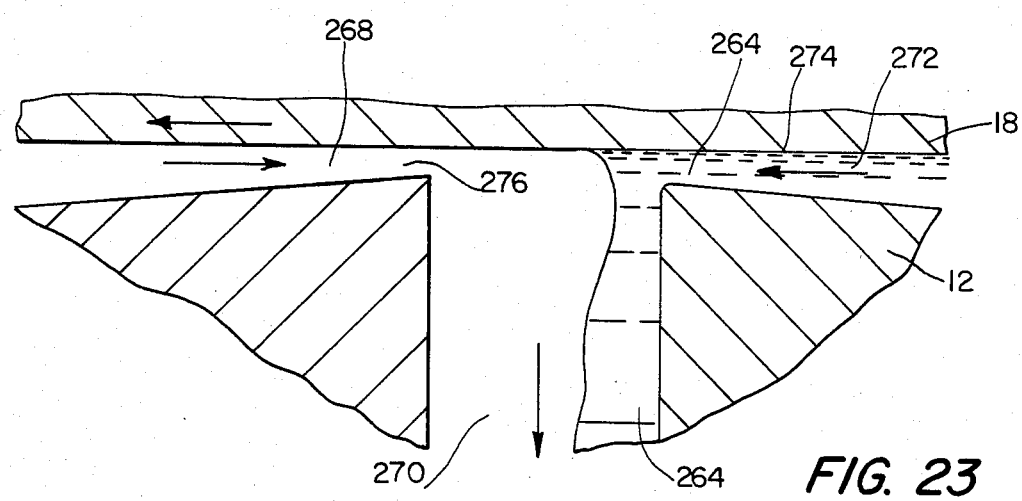
FIG. 23 is a enlarged cross section of the inlet of the discharge channel of the station according to FIG. 21.

Thereupon between successive segments 12 a great number of combinations of supply channels 262 for whether or not hot fluid cleaning medium 264, supply channels 266 for gaseous medium 268 and in between positioned discharge channels 270 are located, see also FIGS. 22 and 23.

The under high pressure via channel 262 supplied cleaning agent 264 moves through the passage section 272 towards the vacuum channel 270 under a hefty whirling and touching of the substrate surface 274, with a removal of contamination from this surface and transport thereof in the flow.

The via channel 268 supplied gases flow in opposite direction via passage section 276 to vacuum channel 270 and thereby remove such cleaning media from the substrate and urge it towards this discharge channel. After passing of a great number of combinations all contamination is removed from the substrate.

Figure 24:
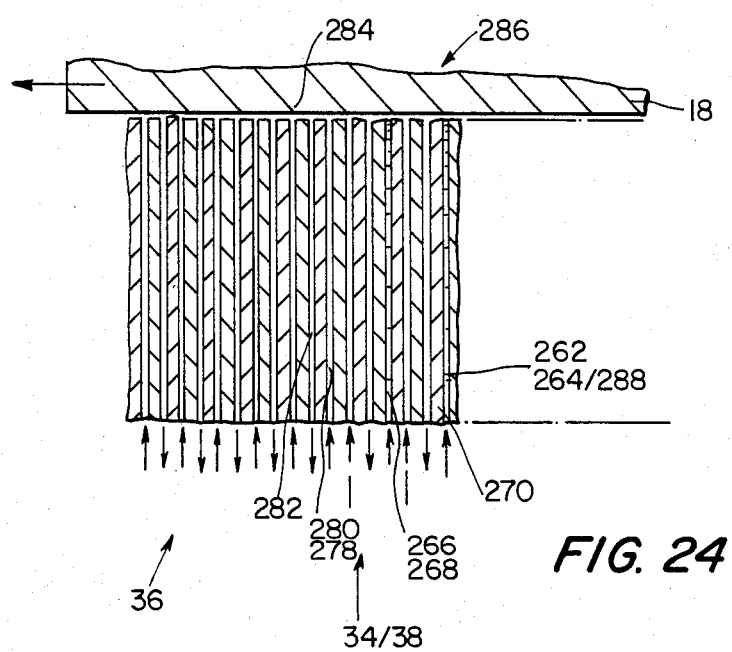
FIG. 24 is a longitudinal cross section of a station for rinsing and following drying of the substrate.

In FIG. 24 the substrate has entered the drying station 36, which station consists of segment packages 286, whereby a number of combinations of supply channels 278 for gaseous medium 280 and vacuum channels 282 are located in these packages. Drying of the substrate 18 takes place by means of hot gases 280, streaming through the passage section 284 along such substrate.

The segment package 286 can also be part of a rinsing section 38, whereby via channels 262 a stream of rinsing fluid 288, as for instance deionized water, alcohol or thinner is urged.

Figure 25:
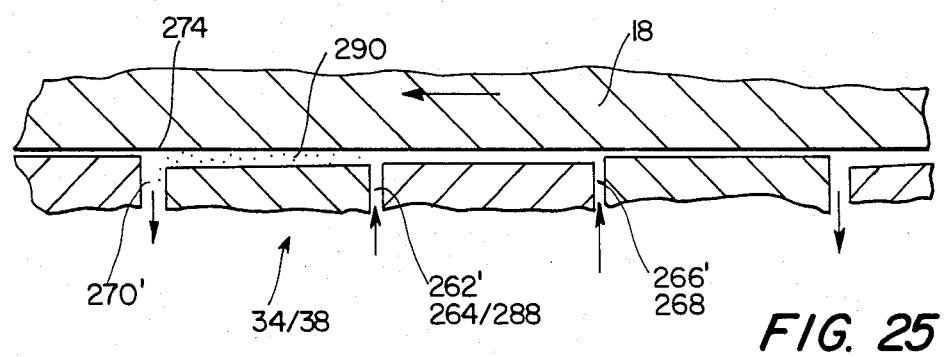
FIG. 25 is an enlarged detail of another embodiment of the station for cleaning of the substrates.
Figure 26:
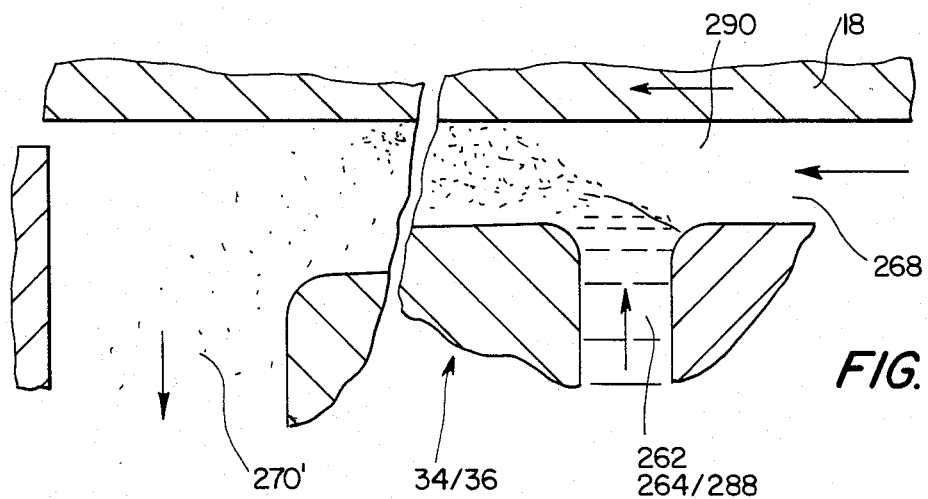
FIG. 26 is an enlarged cross section of the supply- and discharge channel of the station according to FIG. 25.

In FIGS. 25 and 26 another arrangement of channels 262' and 266' and 270' for the cleaning station or the rinsing station is shown. Thereby the gases 268 flow via passage section towards discharge channel 270' and whereby the via supply channel 262' supplied cleaning medium 264 or rinsing medium 288 is urged into the whirling stream of gases.

Within the scope of the invention other arrangements of channels are possible, as for instance combinations of only supply channels for fluid medium and discharge channels. Thereby possibly only in the last part of such station the use of supply channels for gaseous medium.

Figure 27:
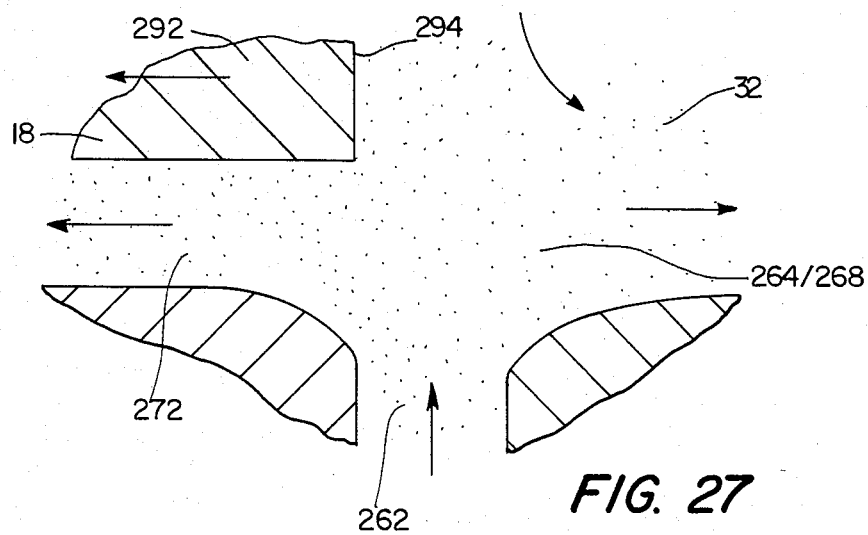
FIG. 27 shows the outlet of a supply channel for fluid medium near the end of substrate.

In FIG. 27 the end 292 of substrate 18 has just passed behind the oppositely located discharge channels 262 with the only limited coverage of side wall 294 of this substrate with cleaning or rinsing agent 264/288.

Figure 28:
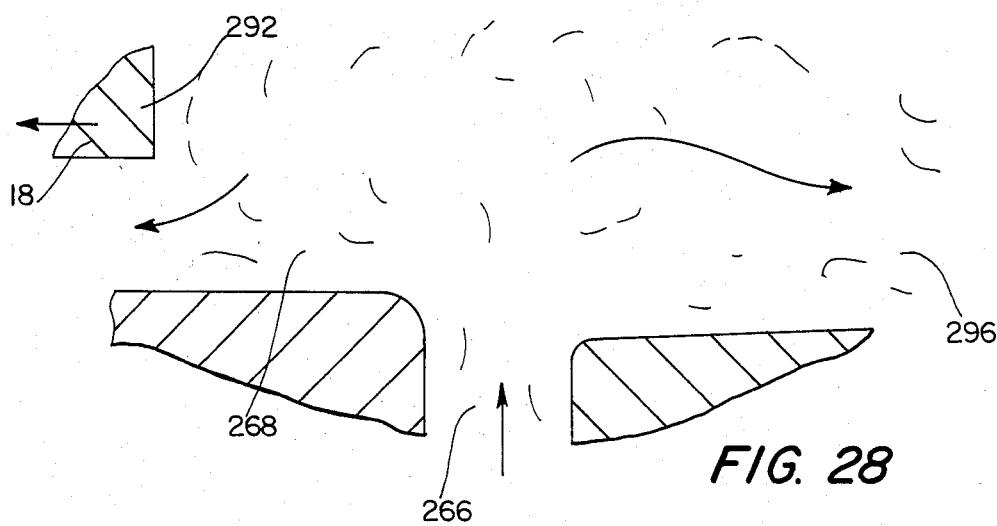
FIG. 28 shows the outlet of another channel for the fluid medium.
Figure 29:
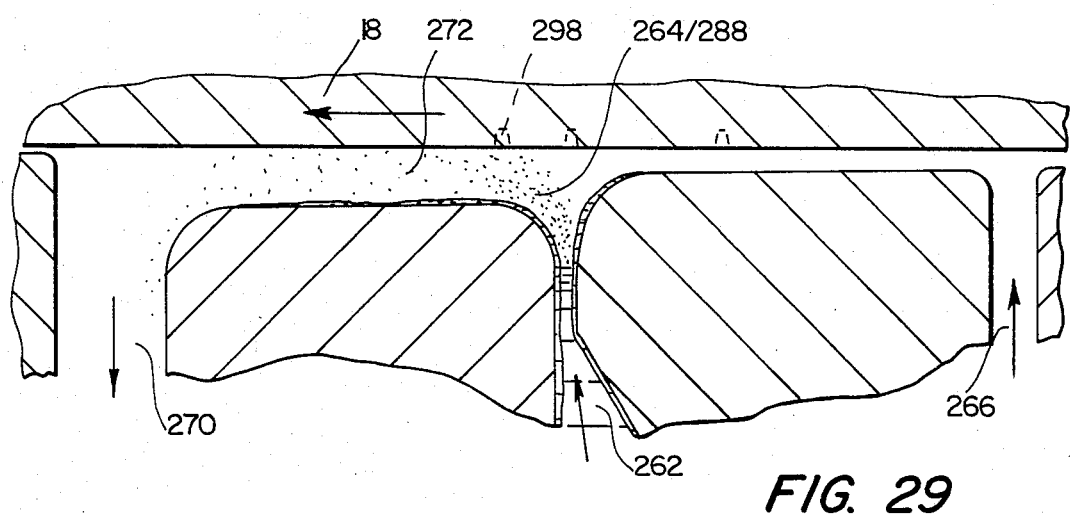
FIG. 29 shows a detail of still another station for rinsing.
Figure 30:
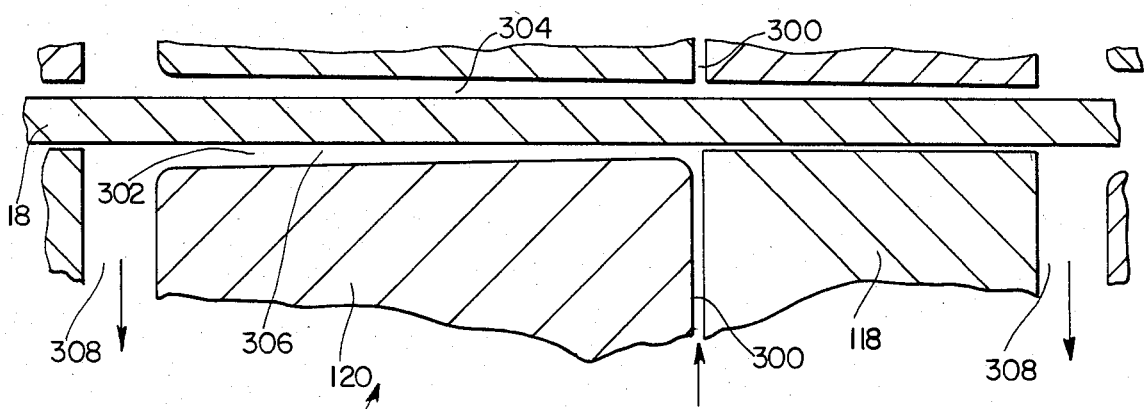
FIG. 30 is an enlarged cross section of a series channels of a dryer.

In FIG. 28 the end 292 of the substrate has passed the oppositely located supply channels 266 for gaseous medium 268 and whereby such flows of gases debouch into passage 296, wherein a negative pressure is maintained. Therefrom such gases are suctioned into not occupied discharge channels.

The cleaning medium 264 and rinsing medium 288 can also be urged toward the substrate 18, in passage sections 304 and 306 due to heat transfer heating of the substrate takes place and thereupon via discharge channels 308 discharge of these gases occurs. The oven can consist of a great number of such combinations of channels.

The heating of the substrate occurs very gradually and at the same time on both sides with minimum differences in temperature. The gases can already be heated outside the cabin. However it is also possible, that part of such heating or all heating takes place in the cabin.

Figure 31:
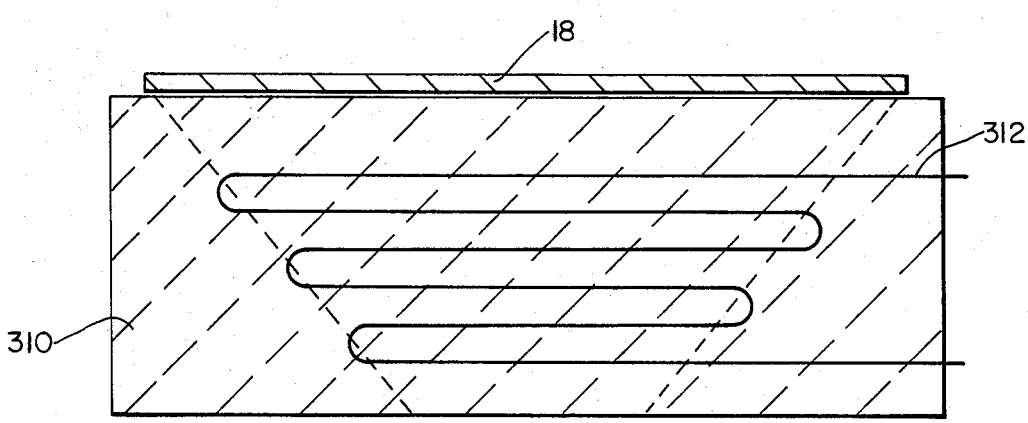
FIG. 31 is a cross section of a segment of an oven, in which a heating element is located.
Figure 32:
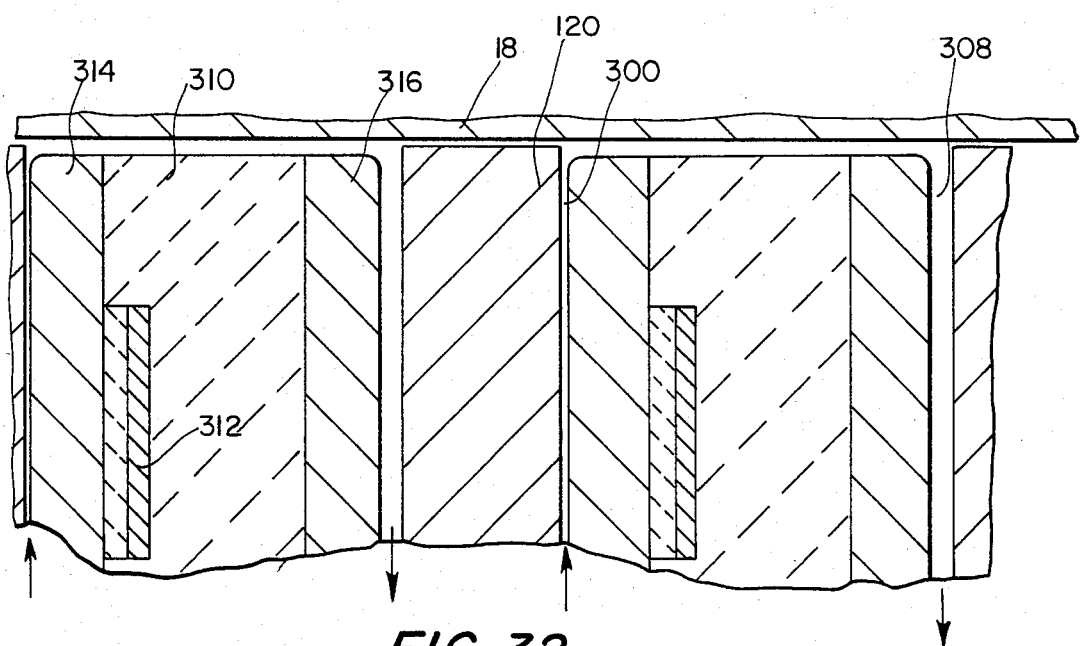
FIG. 32 is an enlarged cross section of an oven, in which segments according to FIG. 31 are located.

In FIGS. 31 and 32 in segment 310 of insulating material an electric heating element is positioned and whereby on two sides of this segment sections 314 and 316 are glued. It is also possible, that such an element is located in a groove of a metal segment.

The heat transfer to the substrate is very effective and very fast, because the volume of the substrate often is very limited. Furthermore, the warm gases hit all left over moisture on the substrate with fastest removal of it.

Because the increase in temperature of the substrate takes place on two sides with no allowable deformations of this substrate, the front section of the substrate can already have passed this oven, the mid section be located in the oven, whereas the rear end of the substrate is still in the rinsing section, as is indicated in FIG. 2.

In that way the dimensions of the apparatus 10 in transport direction are very limited and such also because of the limited length of the stations.

The cooling-off station 52, see FIG. 32, consists of the same packages as shown in station 36 according to FIG. 24 and whereby gases, streaming along the substrate, provide for a gradual, fast and local cooling off.

Figure 33:
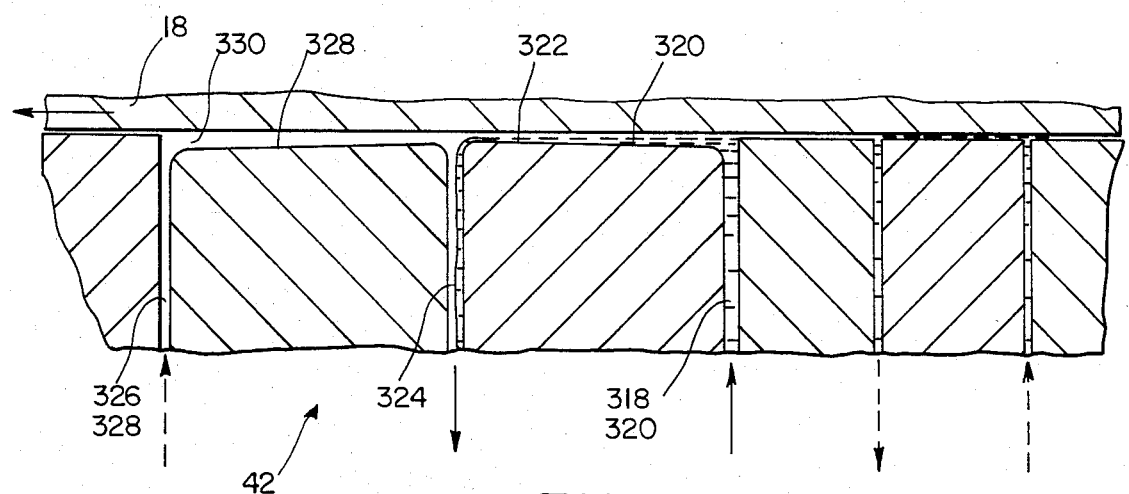
FIG. 33 is an enlarged section of a series of channels of a station for the appliance of fluid for improved adhesion of coating.

In FIG. 33 part of the adhesion promotor station 42 is shown. Via channel 318 supply of such fluid 320 takes place. This fluid thereby flows in the passage section 328 towards the discharge channel 324. Here also the removal from the substrate of the excessive fluid by means of gaseous medium, supplied via channel 326 and urged trough passage section 328 to vacuum channel 324. Whether or not such section can consist of a number of such combinations of channels.

Figure 34:
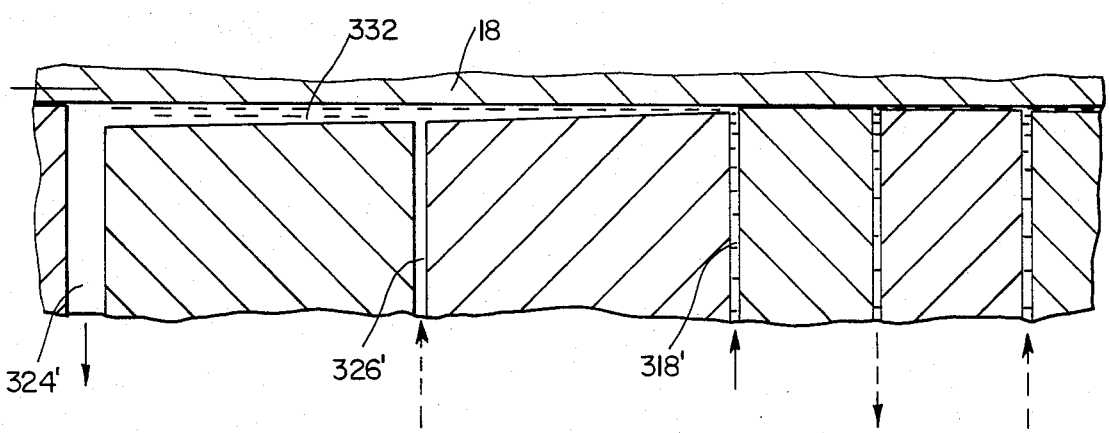
FIG. 34 is a modified structure of the station according to FIG. 33.

In FIG. 34 another arrangement of channels is shown, with successively supply channel 318' for the promotor, supply channel 325' for the gaseous medium and the discharge channel 324'. Thereby the width of the passage section 332 increases in the transport direction.

Figure 35:
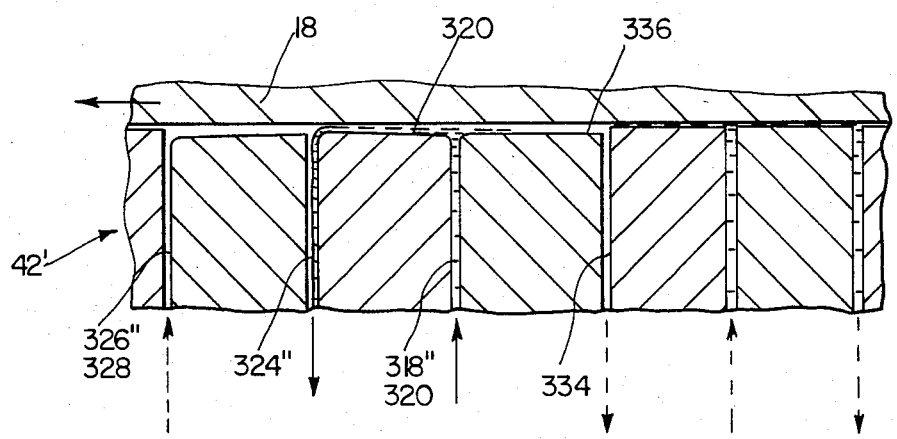
FIG. 35 is the station according to FIG. 33 with a high vacuum discharge channel placed in front of it.

To effectively apply such fluid on a profiled surface of the substrate without the inclusion of gas remnants, it is possible to make use of the station 42'', as shown in FIG. 35. Thereby repeatedly before the applying of fluid 320 via channel 318'', by means of high vacuum channel 334 a very high vacuum is drawn in the passage section 336.

The fluid is now able to fill up all steps in the substrate surface and whereby by means of a channel 326'' supplied warm gas 328 the removal of removable fluid medium takes place and drying of the film fluid, left behind on the substrate can take place.

Thereby it is possible, that such an additional channel 334 is also positioned behind channel 326 or 32'' to withdraw thinner, which due to the high vacuum, is brought into vapor phase.

Figure 36:
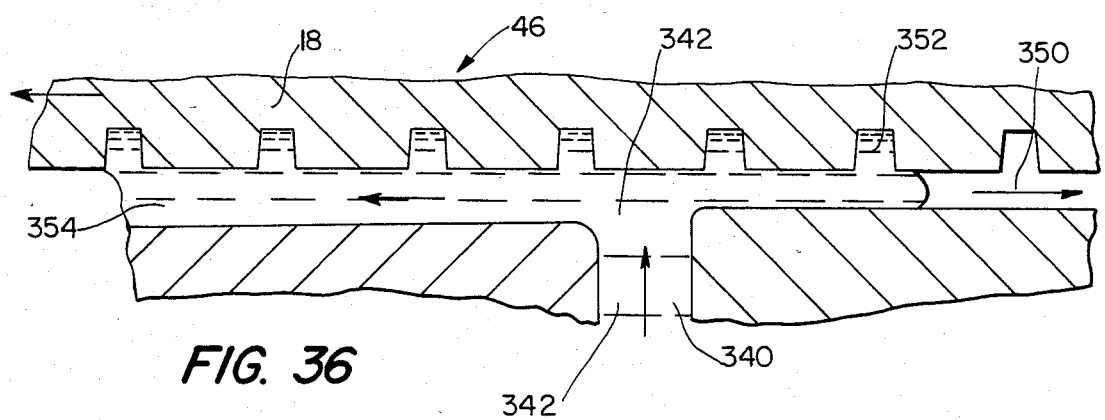
FIG. 36 is an enlarged section of an outlet of a supply channel for coating.
Figure 37:
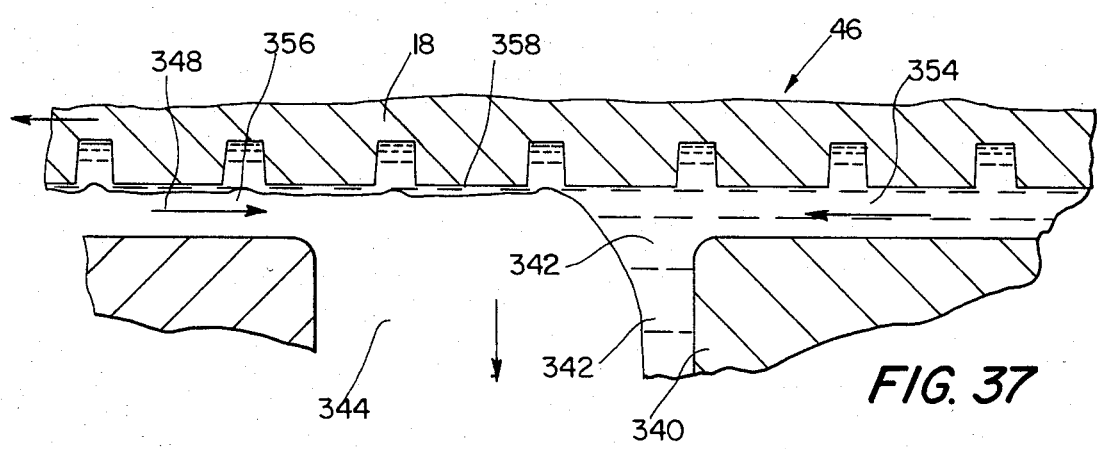
FIG. 37 shows an enlarged section of the channel of FIG. 36.
Figure 37A:
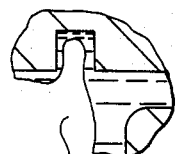
FIG. 37A is a fragmentary enlarged section of the channel of FIGS. 6 and 7.
Figure 38:
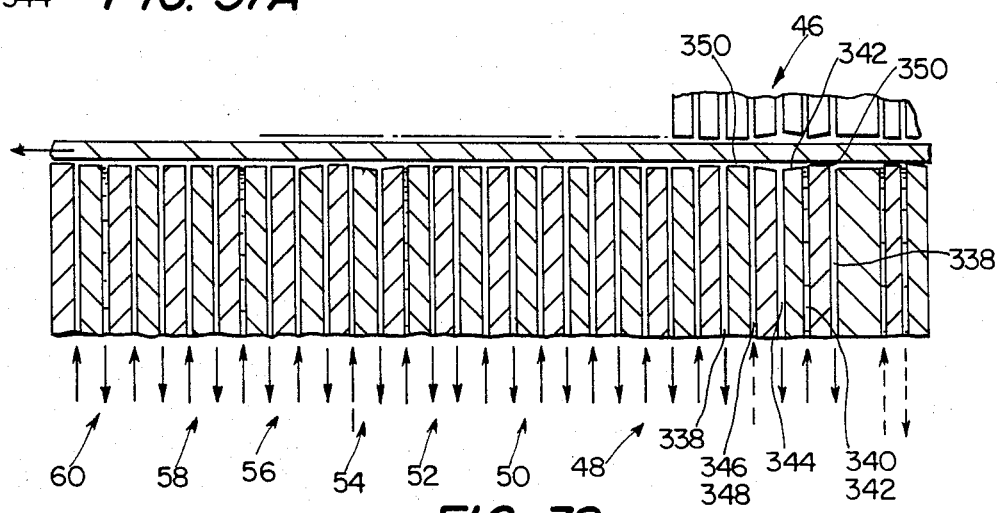
FIG. 38 is a section of a coating station, in which two thin films of coating are successively applied on the substrate with in between drying.

In FIGS. 36, 37 and 38 the first coat station 46 is shown. Thereby the combination of channels consists successively of: high vacuum channel 338, channel 340 for the supply of coating 342, discharge channel 344 and channel 346 for supply of whether or not warm gaseous medium 48. Thereupon possibly a high vacuum channel 338.

In passage section 350 a high vacuum is drawn by high vacuum channel 338, with consequently in the steps 352 of the substrate there is no or almost no gaseous medium left behind. The channel 340 supplied coating 342 fills these steps without inclusion of another medium, which is of greatest importance for an ultimately regular film of coating. The coating fills also the total passage section 354 towards the vacuum channel 344.

Gaseous medium 348, supplied through channel 346, flows in opposite direction through passage section 356 towards this discharge channel under stripping off of the excessive coating from the substrate surface 358. This stripping off of coating co-operates with the micro-meniscus effect of the coating 345, which as a column moves along the wall section 360 of the discharge channel 344 and by means of the vacuum in this channel is drawn from the substrate and out of the passage section 354. Thereby this column of coating exercises a pulling cohesion force on the thin film of coating, left behind on the substrate.

Dependent on the viscosity of the coating the thickness varies. With a very low viscosity of the coating also in the steps a very thin film of coating will be left behind, see FIG. 37$^a$.

This coating station 46 is combined shown with the drying-, oven- and cooling-off stations 48, 50 and 52, following thereupon. The number of combinations of channels can vary to meet the demands. By using warm gaseous medium, through which in particular a very thin film of coating is heated very fast, and by applying a high vacuum in the discharge channels with consequently a lowering of the boiling point of the thinner in the coating, such thinner is evaporated out of the film coating very fast. As a result, an extremely fast drying of the coating layer occurs.

In the second coating station 54 with identical vacuum-, supply- and discharge channels the applying of a second coating layer takes place, whereafter again in the successive stations 56, 58 and 60 by means of gaseous medium drying, hardening and cooling-off of this second coating layer takes place.

Figure 39:
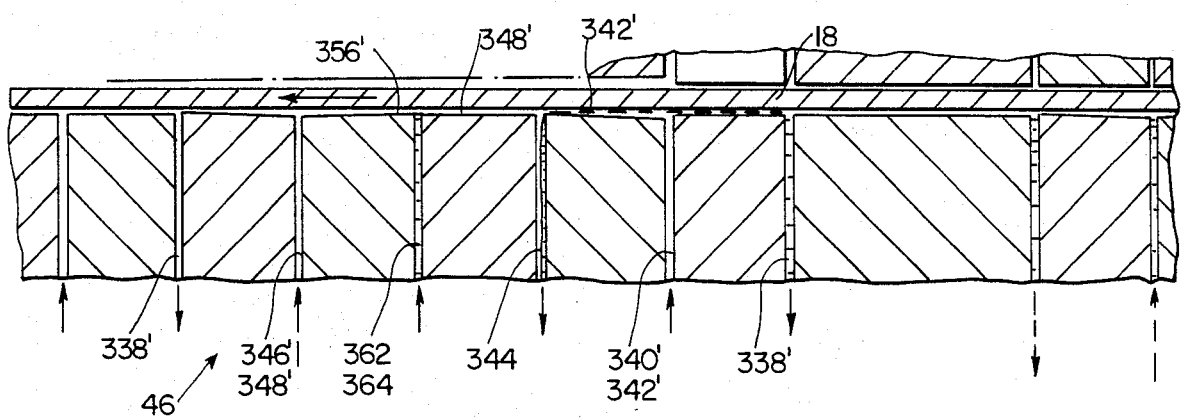
FIG. 39 is an enlarged section of a coating station, whereby a combination of thinner and gaseous medium is fed over the applied film.

In FIG. 39 another embodiment 46' of the coating station is shown, whereby through channel 362 a thinner 364 for the coating 342 in vapor phase or mist is urged towards the stream of gaseous medium 348, flowing through passage section 356' to the discharge channel 344'. This thinner helps to remove a thinned top coat from the coating layer, applied on the substrate.

Figure 40:
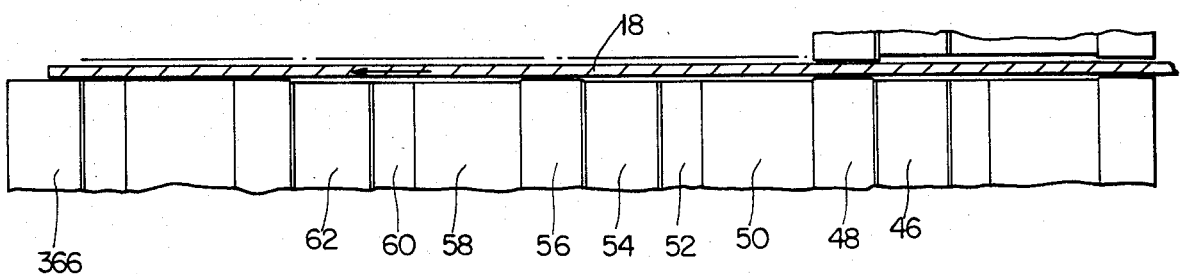
FIG. 40 shows a series of coating stations with in between drying.

In FIG. 40 the successive coating stations 46, 54, 62 and 366 are shown with repeatedly the following drying-, oven- and cooling-off stations.

Figures 41A, 41B, 41C, 41D, 41E:
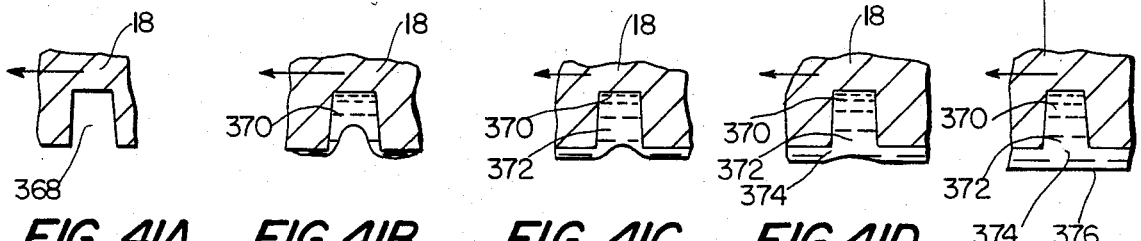
FIG. 41 shows the filling up of a stepped substrate surface with a series of applied coatings.

It is possible to fill up the steps, located in the substrates, as is shown in FIGS. 41$^{A, B, C, D, E}$.

In FIG. 41$^A$ the step 368 is pre-treated and has arrived in a vacumized area. In Station 46 the applying of the first coating layer 370 has taken place, see FIG. 41$^B$, in station 54 the second layer 372, see FIG. 41$^C$, in station 64 the third layer 374 on top of the second layer, see FIG. 41$^D$, and in station 366 the fourth layer 376 on the third layer, see FIG. 41$^E$.

As a result, such a step is completely filled with coating and is an almost smooth surface of the applied coating layer achieved.

Figure 42:
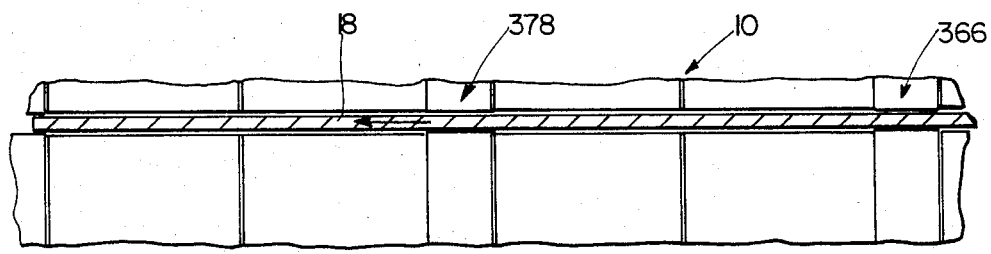
FIG. 42 is a sectional view of part of the coating station according to FIG. 40 together with a coating and oven station to apply a thin top coat on the thick under coat.

In FIG. 42 the apparatus 10 is provided with the additional coating station 378, whereby on the fourth layer 376, see FIG. 43$^A$, an extremely thin coatng layer 380 is applied, see FIG. 43$^B$.

With the above described processing it is possible to apply a great number of coating layers on a substrate over a cabin length of 20-40 cm. Thereby the quality of the combined coating layers can be much higher as with the existing apparatus, because:

1. no contamination in the coating;
2. no extreme escape of air or gases out of the applied coating; and
3. a shorter escape distance for the vaporized thinner during the processing.

In FIG. 44 coating station 45" is shown, whereby the thinner as a mist or in vapor phase is brought in the gaseous medium 348. During the moving of this thinner saturated medium over the applied coating, see also FIG. 45, the top layer of this coating is thinned and can be removed near the inlet of the discharge channel 344".

In FIG. 46 a coating station 46''' is shown, whereby through channel 382 water or other non thinning fluid is urged to the passage section 356''' and this fluid as an extremely thin film 384 covers the already applied coating 342. By means of gaseous medium 348 such film is urged towards the discharge channel 344''', see also FIG. 47. This film helps to remove coating from the already applied coating layer 386.

Within the scope of the invention still other variations in the arrangement of channels in the coating station are possible.

In FIG. 48 a station 388 is a part of the apparatus. Thereby a developing agent 392 is urged towards and over the substrate 18. In this stations use is made of a number of similar or almost similar combination of channels. Such a combination consists of a high vacuum channel 338, supply channel 390 for the developing agent 392, two channels 394 and 396 for the supply of gaseous medium 398 and discharge channel 400. At the upper side of the cabin similar combinations are located to urge developing- or other agent to the substrate.

The combination of gases and developing agent flows through passage section along the substrate. Due to the vacumized steps 404 of the substrate these steps become totally filled with this agent, whirling therein. The under high pressure supplied gases move through passage section 406 with an accompanying strong whirling action and such in particular in the steps 404.

By means of a successively repeating of this processing a complete removal of all removable coating from the substrate is achieved.

In FIG. 50 a detail of the outlet 408 of channel 388 for the developing agent 390 is shown, whereby this agent under very high pressure and speed is urged toward the substrate. In this outlet a narrow section 410 and a widening 412 are located for faster removal of coating from the steps 404.

Because the passage for the substrates contains no moving element, such passage may be filled with the media. In a following station section 414, see also FIG. 48, a number of combinations of supply channels for gaseous medium 418 and vacuum channels 420 remove such a cloud of media.

In FIG. 51$^A$ such a mist of developing agent 390 and gases 398 in passge section 422 is shown after passing of the supply channel 390 by the substrate.

In FIG. 51$^B$ is shown, how such a cloud by means of gaseous medium 418 is urged towards the high vacuum channel 420.

After the passing of such station the substrate moves through a rinsing station.

In FIG. 52 the station 424 of the apparatus is shown, wherein dopant as fluid or gaseous medium is urged towards the substrate and such under an extremely high pressure. Through channel 426 the dopant 428 is urged towards this substrate, effects the surface of the substrate in passage section 430 and is removed through discharge channel 432.

Here again a preferred withdrawal of gases through a high vacuum channel before the processing. Furthermore, via channel 434 gaseous medium 436 is supplied for removal of residue dopant 440 in passage section 438 and such in particular from the steps 442.

In the station such combination of channels successively repeats. Furthermore, after channel 434 a high vacuum channel can be positioned.

In FIG. 53 a modification 424' of this station is shown. Thereby in the upper and lower cabin part the repeated combinations of high vacuum channel 444, channel 426' for supply of dopant 428, four channels 446, 448, 450 and 452 for gaseous medium 436 and a high vacuum channel 454. Thereby the dopant with a hefty whirling action is moving through this passage section.

On one side of the substrate other media can be supplied to the substrate.

As dopant for instance arsenicum or phosphor can be used with exact volumes per second of processing.

A transport system and the processes as above described can be used in conjunction with plasma etching, magnetron sputtering and other complex processes.

Furthermore, in the apparatus stations for pattern exposure and measurements can be located.

I claim:

1. Apparatus for longitudinal transport and processing of substrates comprising:
   a. a housing;
   b. an upper block and a lower block superposed with respect to each other and supported by said housing so as to define an elongated longitudinal passage between the opposed faces of said upper block and said lower block;
   c. at least one fluid medium supply channel defined within one of said blocks and communicating with a fluid medium supply at one end and extending at its other end into said longitudinal passage, and
   d. at least one fluid medium discharge channel defined in one of said blocks and extending into said longitudinal passage;
said supply channel and said discharge channel being positioned so that over at least part of said passage fluid cushions are maintained on both sides of the substrates within said passage.

2. Apparatus for longitudinal transport and processing of substrates as in claim 1, wherein said upper block and said lower block include a plurality of segments defining fluid medium supply channels and fluid medium discharge channels intersecting said longitudinal passage between said segments.

3. Apparatus for longitudinal transport and processing of substrates as in claim 2, wherein in between said segments vaccum discharge channels communicating with said longitudinal passage are defined between adjacent segments.

4. Apparatus for longitudinal transport and processing of substrates as in claim 3, said fluid medium supply being pressurized so as to provide a fluid medium cushion on both sides of the advancing substrate, such that the substrate remains free of contact with said segment.

5. Apparatus for longitudinal transport and processing of substrates as in claim 4, wherein at least part of said longitudinal passage is defined by the opposed ends of said segments.

6. Apparatus for longitudinal transport and processing of substrates as in claim 5, wherein a plurality of fluid medium supply channels are defined for a single fluid medium and a plurality of discharge channels are defined for said fluid medium.

7. Apparatus for longitudinal transport and processing of substrates as in claim 6, wherein said segments contain recesses defining respectively said fluid medium supply channels.

8. Apparatus for longitudinal transport and processing of substrates as in claim 6, wherein said plurality of fluid medium supply channels extends longitudinally over a length greater than the substrate such that the supply of fluid medium cannot be interrupted by an advancing substrate section.

9. Apparatus for longitudinal transport and processing of substrates as in claim 8, wherein a fluid medium flow restricter is positioned within said fluid medium supply channel, so as to restrict fluid medium flow towards said substrates.

10. Apparatus for longitudinal transport and processing of substrates as in claim 9, wherein said flow restriction is greater than that of the corresponding longitudinal passage section encompassing the substrate, advancing in a midposition through said passage.

11. Apparatus for longitudinal transport and processing of substrates as in claim 10, wherein the segments of the upper block and the segments of the lower block define arrangements of opposed fluid medium supply channels and fluid medium discharge channels on both sides of said substrate.

12. Apparatus for longitudinal transport and processing of substrates as in claim 11, wherein segment ends in said upper block and segment ends in said lower block define fluid medium cushions of micro-height on one side of the substrate and fluid medium cushions of greater height on the other side of said substrate.

13. Apparatus for longitudinal transport and processing of substrates as in claim 12, wherein the segment ends on both sides of said substrate define a fluid medium cushion of sufficient height such that a laterally uninterrupted flow of fluid medium may be urged towards the passing substrate and at least part of said uninterrupted flow of fluid medium may be removed.

14. Apparatus for longitudinal transport and processing of substrates as in claim 13, wherein in said upper block and in said lower block adjacent gaseous medium supply channels and gaseous medium discharge channels are arranged, so as to maintain a cushion of gaseous medium in said longitudinal passage along both surfaces of said moving substrate.

15. Apparatus for longitudinal transport and processing of substrates as in claim 14, wherein in said upper block and in said lower block common discharges for both fluid medium and gaseous medium are arranged.

16. Apparatus for longitudinal transport and processing of substrates as in claim 15, wherein said segments in said upper block and said segments in said lower block define fluid medium supply channels and adjacent gaseous medium supply channels such that fluid medium is urged towards said substrate while gaseous medium is also urged towards said substrate and said fluid medium and said gaseous medium are discharged through common discharge channels.

17. Apparatus for longitudinal transport and processing of substrates as in claim 16, wherein at least part of said supply channels and said discharge channels are arranged so as to induce moving transport of the substrates.

18. Apparatus for longitudinal transport and processing of substrates as in claim 15, wherein in said upper block and said lower block high vacuum channels are arranged such that fluid medium being delivered through an adjacent fluid medium supply channel is urged along said substrate towards said high vacuum channels.

19. Apparatus for longitudinal transport and processing of substrates as in claim 17, wherein said vertical segments define adjacent high vacuum channels, fluid medium supply channels, gaseous medium supply channels and discharge channels for both fluid medium and gaseous medium.

20. Apparatus for longitudinal transport and processing of substrates as in claim 19, wherein in said upper block and in said lower block high vacuum discharge channels are arranged for both fluid medium and gaseous medium.

21. Apparatus for longitudinal transport and processing of substrates as in claim 10, wherein said upper block segments and said lower block segments define between combinations of supply and discharge channels a passage wall section having its end extending farther into said passage than the passage wall sections between said supply and discharge channels.

22. Apparatus for longitudinal transport and processing of substrates as in claim 21, wherein said upper block segments and said lower block segments define a series of gaseous medium supply channels with intervening discharge channels adapted for drying during moving transport of said substrate.

23. Apparatus for longitudinal transport and processing of substrates as in claim 22, wherein said housing includes a plurality of channels interconnecting fluid medium and gaseous medium supply channels.

24. Apparatus for longitudinal transport and processing of substrates as in claim 23, wherein said upper block segments and said lower block segments define a series of cleaning agent supply channels intervening cleaning agent discharge channels as a cleaning station in said longitudinal passage.

25. Apparatus for longitudinal transport and processing of substrates as in claim 24, wherein said segments define a series of transversely as well as longitudinally displaced high pressure cleaning agent supply channels, such that a laterally uninterrupted stream of cleaning agent is discharged over the entire width of the advancing substrate.

26. Apparatus for longitudinal transport and processing of substrates as in claim 25, including a rinsing station adjacent said cleaning station, said rinsing station being defined by opposed segments defining rinsing agent supply channels with intervening rinsing agent discharge channels intersecting said longitudinal passage.

27. Apparatus for longitudinal transport and processing of substrates as in claim 26, wherein said rinsing medium supply channels extend transversely across said passageway such that an uninterrupted stream of rinsing agent is discharged over the width of the advancing substrate.

28. Apparatus for longitudinal transport and processing of substrates as in claim 10, including a coating station defined by adjacent passages in said segments on at least one side of said passageway including coating supply channels.

29. Apparatus for longitudinal transport and processing of substrates as in claim 28, including a supply of pressurized low viscosity adhesion promoting agent, said adhesion promotion agent supply channels longitudinally and transversely intersecting said passageway, such that suction force of said discharge channels together with pressurized gaseous medium removes the adhesion promotion agents and only a very thin layer of the adhesive promotion agent remains on the substrate.

30. Apparatus as in claim 29, said segments opposed to the coating supply channels defining a series of thinning agent supply channels with adjacent thinning agent discharge channels such that thinning agent is urged towards and along the substrate by means of the suction force of the thinning agent discharge channels, such that thinning agent, together with gaseous medium, is almost entirely removed from the substrate.

31. Apparatus for longitudinal transport and processing of substrates as in claim 30, including a drying station mounted in said upper block and said lower block sequentially of said coating supply channels.

32. Apparatus for longitudinal transport and processing of substrates as in claim 31, wherein said upper block and said lower block define a plurality of high vacuum channels sequentially of said coating supply channels such that said high vacuum removes most of the gaseous medium from the surface of the substrate.

33. Apparatus for longitudinal transport and processing of substrates as in claim 20, wherein a drying station is mounted in said upper block and said lower block sequentially of said coating station and thereafter a sequential combination of coating and drying stations is repeated.

34. Apparatus for longitudinal transport and processing of substrates as in claim 33, wherein an oven station defined by hot gaseous medium supply channels intersecting said passage in maintained sequentially of said coating station.

35. Apparatus for longitudinal transport and processing of substrates as in claim 34, including a microwave oven station intersecting said passage so as to harden said applied coating.

36. Apparatus for longitudinal transport and processing of substrates as in claim 35, including a cooling off station sequentially of said oven station, said cooling off station being defined by opposed cooling off medium supply channels and cooling off medium discharge channels defined in said upper block and said lower block.

37. Apparatus for longitudinal transport and processing of substrates as in claim 10, including a developing station mounted in said longitudinal passage having a series of developing agent supply channels defined by said segments in at least one of blocks so as to urge developing agent towards and along the passing substrates.

38. Apparatus for longitudinal transport and processing of substrates as in claim 10, including a plasma etch station having a plasma source positioned outside said upper and lower block, so as to urge plasma in gaseous phase through plasma supply channels intersecting said passage and onto said substrates.

39. Apparatus for longitudinal transport and processing of substrates as in claim 18, said coating material supply channels being configured to deliver coating material in particles, vapor and gaseous phase.

* * * * *